(12) United States Patent
Kawakita et al.

(10) Patent No.: US 9,703,197 B2
(45) Date of Patent: Jul. 11, 2017

(54) HIGH-SENSITIVITY MULTILAYER RESIST FILM AND METHOD OF INCREASING PHOTOSENSITIVITY OF RESIST FILM

(71) Applicant: NATIONAL INSTITUTE FOR MATERIALS SCIENCE, Ibaraki (JP)

(72) Inventors: Jin Kawakita, Ibaraki (JP); Toyohiro Chikyo, Ibaraki (JP); Takayuki Nakane, Ibaraki (JP)

(73) Assignee: NATIONAL INSTITUTE FOR MATERIALS SCIENCE, Ibaraki (JP)

( * ) Notice: Subject to any disclaimer, the term of this patent is extended or adjusted under 35 U.S.C. 154(b) by 0 days.

(21) Appl. No.: 15/024,407

(22) PCT Filed: Sep. 25, 2014

(86) PCT No.: PCT/JP2014/075422
§ 371 (c)(1),
(2) Date: Mar. 24, 2016

(87) PCT Pub. No.: WO2015/046327
PCT Pub. Date: Apr. 2, 2015

(65) Prior Publication Data
US 2016/0238937 A1 Aug. 18, 2016

(30) Foreign Application Priority Data

Sep. 26, 2013 (JP) .................................. 2013-199700
May 30, 2014 (JP) .................................. 2014-111883

(51) Int. Cl.
*G03F 7/20* (2006.01)
*G03F 7/32* (2006.01)
(Continued)

(52) U.S. Cl.
CPC ................ *G03F 7/11* (2013.01); *G03F 7/091* (2013.01); *G03F 7/20* (2013.01); *G03F 7/32* (2013.01);
(Continued)

(58) Field of Classification Search
None
See application file for complete search history.

(56) References Cited

U.S. PATENT DOCUMENTS 4,330,708 A * 5/1982 Meisburger ............ H01J 37/12
250/396 ML
4,434,217 A * 2/1984 Masters .................... G03F 1/54
430/14
(Continued)

FOREIGN PATENT DOCUMENTS

JP 54-092061 * 7/1979
JP 60-178623 * 9/1985
(Continued)

OTHER PUBLICATIONS

Choi et al., "Fabrication of nanometer size photoresist wire patterns with a silver nanocrystal shadowmask". J. Vac. Sci. Technol. A vol. 17(4) pp. 14251427 (Jul. 1999).*
(Continued)

*Primary Examiner* — Martin Angebranndt
(74) *Attorney, Agent, or Firm* — Wenderoth, Lind & Ponack, L.L.P.

(57) ABSTRACT

A resist film structure is provided, which allows a resist layer to have improved photosensitivity to EUV or electron beams without changing the photosensitivity of the resist material itself. A metal layer 1 with a thickness as small as a nanometer level is provided on a resist polymer layer 2 formed on a substrate 3. When the resist layer in this structure is exposed to light, the metal layer 1 produces a
(Continued)

surface plasmon effect to enhance the irradiation to the resist film, so that the photosensitivity of the resist film is improved.

5 Claims, 11 Drawing Sheets

(51) Int. Cl.
*G03F 7/09* (2006.01)
*G03F 7/11* (2006.01)
*H01L 21/027* (2006.01)

(52) U.S. Cl.
CPC ...... *H01L 21/0274* (2013.01); *H01L 21/0277* (2013.01); *H01L 21/0278* (2013.01)

(56) References Cited

U.S. PATENT DOCUMENTS

| | | | | | |
|---|---|---|---|---|---|
| 4,467,026 | A | * | 8/1984 | Ogawa | G03F 7/094 250/492.2 |
| 5,030,549 | A | * | 7/1991 | Hashimoto | G03F 7/0047 430/296 |
| 5,637,425 | A | * | 6/1997 | Lee | G03F 1/26 430/311 |
| 9,261,784 | B2 | * | 2/2016 | Wuister | C08F 30/08 |
| 2005/0008864 | A1 | * | 1/2005 | Ingen Schenau | G03F 1/22 428/411.1 |
| 2006/0234168 | A1 | | 10/2006 | Kim et al. | |
| 2011/0305994 | A1 | * | 12/2011 | Montelius | G03F 1/54 430/322 |
| 2013/0029270 | A1 | * | 1/2013 | Hatakeyama | G03F 7/0043 430/284.1 |
| 2016/0238937 | A1 | * | 8/2016 | Kawakita | G03F 7/11 |

FOREIGN PATENT DOCUMENTS

| | | | |
|---|---|---|---|
| JP | 60-222849 | | 11/1985 |
| JP | 61-150326 | * | 7/1986 |
| JP | 63-170919 | * | 7/1988 |
| JP | 2-19850 | | 1/1990 |
| JP | 4-281456 | | 10/1992 |
| JP | 2002-184045 | | 6/2002 |
| JP | 2004-144925 | | 5/2004 |
| JP | 2004-219695 | | 8/2004 |
| JP | 2004-317964 | | 11/2004 |
| JP | 2010-275180 | | 12/2010 |

OTHER PUBLICATIONS

Ueno et al., "Homogeneous nano-patterning using plasmon-assisted photolithography". Appl. Phys. Lett., vol. 99(1), 011107 (3 pages) (Jul. 2011).*
Dey et al. "Stitching errors reduction in electron beamSamantaray et al. lithography with in situ feedback using self developing resist", J. Vac. Sci. Technol., vol. 31(6) pp. 06F409 (5 pages) (Nov. 2013).*
Samantaray et al., "The effect of thin metal overlayers on the electron beams exposure of polymethyl methacrylate", J. Vac. Sci. Technol., vol. 26(6) pp. 2300-2305 (Nov. 2008).*
International Search Report (ISR) issued Dec. 22, 2014 in International (PCT) Application No. PCT/JP2014/075422.
Suigen Kyoh et al., Toshiba Review, vol. 67, No. 4, pp. 36-40, 2012, with English abstract.
Takahiro Suzuki et al., Journal of the Crystallographic Society of Japan, 50, pp. 282-287, 2008, with English abstract.
Wikipedia, "Surface Plasmon Resonance," http://ja.wikipedia.org/wiki/%E8%A1%A8%E9%9D%A2%E3%83%97%E3%83%A9%E3%82%BA%E3%83%A2%E3%83%B3%E5%85%B1%E9%B3%B4.
Elito Kazawa, Bulletin of Tokyo Metropolitan Industrial Technology Research Institute, No. 6, pp. 14-17, 2011, with English abstract.
Daisuke Shimizu et al., JSR Technical Review, No. 114, pp. 9-14, 2007, with English abstract.
Katsutomo Tanaka et al., NanotechJapan Bulletin vol. 3, No. 6, pp. 16-1-16-7, 2010.
http://techon.nikkeibp.co.jp/article/Feature/20130514/281330/, pp. 1-4, Feb. 17, 2016.

* cited by examiner (a)

(b)

(c)

(a)

(b)

US 9,703,197 B2

HIGH-SENSITIVITY MULTILAYER RESIST FILM AND METHOD OF INCREASING PHOTOSENSITIVITY OF RESIST FILM

TECHNICAL FIELD

The present invention relates to a resist film for use in photolithography. More specifically, the invention relates to a high-sensitivity laminated resist film with significantly improved sensitivity and to a method of improving the sensitivity of a resist film.

BACKGROUND ART

In order to achieve fine processing of 10 nm or less in semiconductor manufacturing, research and development has been conducted on photolithography technologies using extreme ultraviolet (EUV) light (Non Patent Literature 1). At present, however, since the EUV light power is low, it is a very effective measure to improve the sensitivity of resist films on the light-receiving side. Conventionally, for this purpose, researches have been conducted to improve the sensitivity by modifying the structure and composition of organic compounds, such as polymers, used to form resist films. However, such researches have not achieved a satisfactory level of sensitivity yet. A search for a novel resist material, which requires a lot of time and resources, does not always guarantee to find a useful material. A breakthrough based on introduction of a new idea is needed to improve the sensitivity of resist films for EUV light, electron beams, and the like.

SUMMARY OF INVENTION

Technical Problem

It is therefore an object of the invention to dramatically improve the sensitivity of resist polymer films by adding a supplemental film to the resist films without modifying its own chemical structure or composition.

Solution to Problem

In order to solve the problem described above, according to the invention, there is provided a high-sensitivity laminated resist film comprising: a resist polymer film; and a metal layer provided on the resist polymer film, wherein on exposure the metal layer enhances the irradiation to the resist polymer film.

The metal layer may be provided on the resist polymer film with a thickness that allows EUV light or an electron beam to at least partially pass therethrough.

The metal layer may comprise a metal or an alloy containing a metal selected from the group consisting of Ag, Au, Pt, Pd, Cu, Al, and Ni.

The metal layer may have a linear structure, an island structure, or a mesh structure.

The high-sensitivity laminated resist film may be exposed to EUV light or an electron beam.

The metal layer may have a thickness of at most 15 nm.

According to the invention, there is provided a method of improving sensitivity of a resist film, comprising the steps of: forming any of the high-sensitivity laminated resist film; and subjecting the formed high-sensitivity laminated resist to exposure.

A line may be formed in the high-sensitivity laminated resist film by the exposure.

The method of improving sensitivity of a resist film further may further comprise the step of removing the metal layer by developing the high-sensitivity laminated resist film after the exposure.

Advantageous Effects of Invention

According to the invention, the metal layer provided on the resist polymer film can provide a sensitivity much higher than the inherent sensitivity of the resist polymer film.

DESCRIPTION OF EMBODIMENTS

Figure 1:
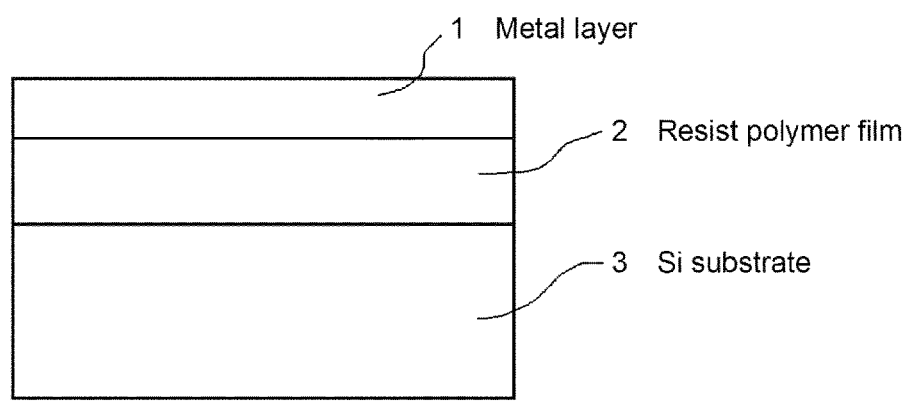
FIG. 1 is a schematic diagram of an example of the laminated resist film of the invention.
Figure 2:
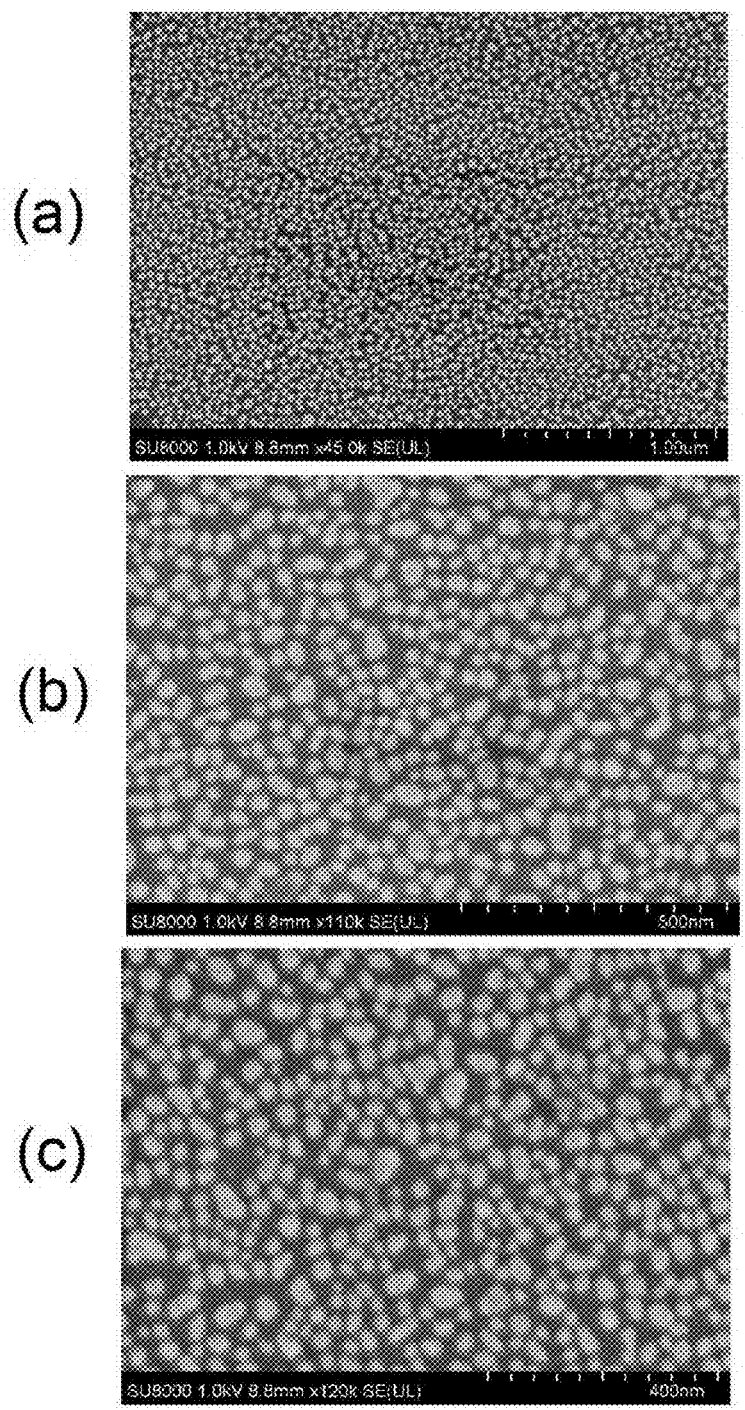
FIGS. 2(a), 2(b), and 2(c) are SEM images of a 5-nm-thick metal layer.
Figure 3:
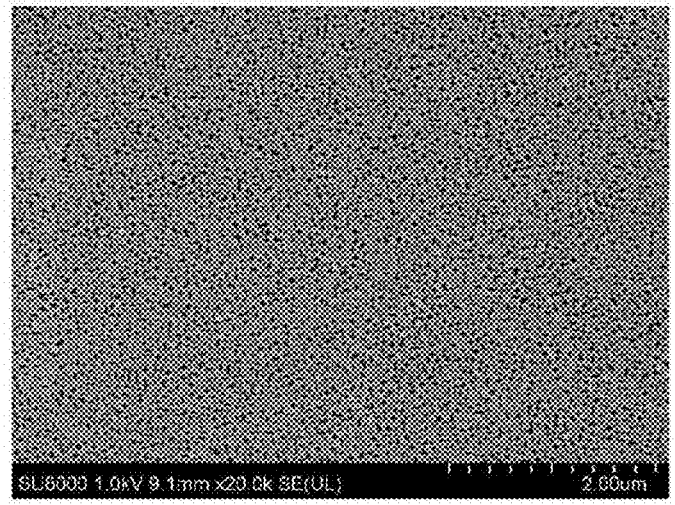
FIGS. 3(a), 3(b), and 3(c) are SEM images of a 10-nm-thick metal layer.
Figure 3:
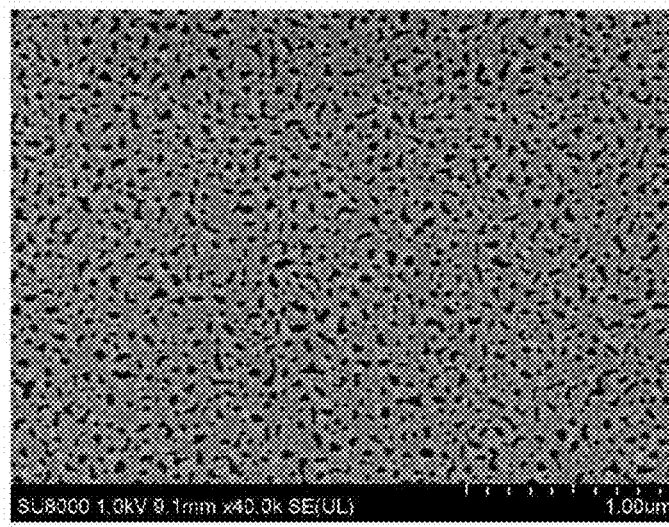
Figure 3:
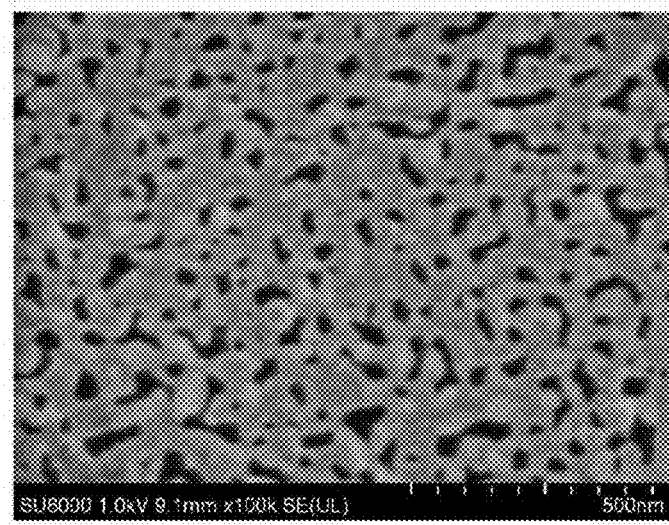
Figure 4:
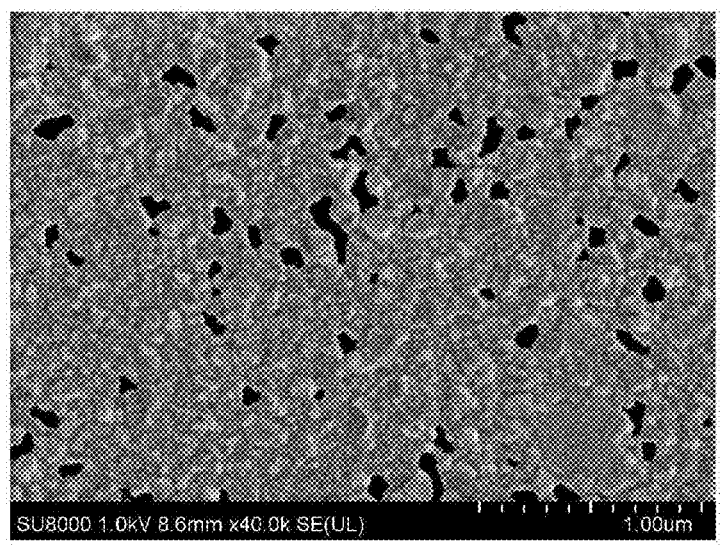
FIGS. 4(a) and 4(b) are SEM images of a 20-nm-thick metal layer.
Figure 4:
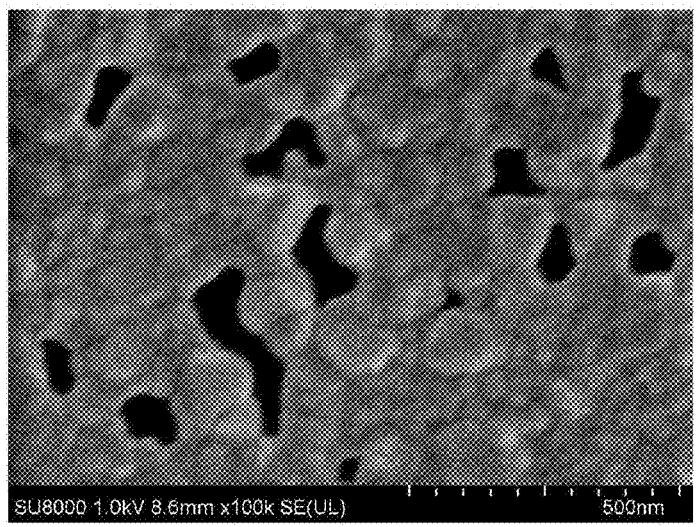

In the invention, as shown in FIG. 1 which is a schematic diagram of a typical embodiment, a metal layer 1 is provided directly on the surface of a resist polymer film 2 or provided on the surface of a resist polymer film 2 with another film interposed therebetween. This structure allows enhancement of light applied to the resist polymer film 2, which results in an improvement in the photosensitivity of the resist film. In the examples described below, sputtering is used as a method for depositing the metal layer 1 on the surface of the resist polymer film 2. However, not only sputtering but also any other vapor phase method such as vacuum deposition, photo-excited deposition, or ion plating may be used, and a liquid phase method using a complex or the like may also be used.

In the invention, regardless of the method employed, the metal film 1 may be deposited directly on the surface of the resist polymer film 2, or an intermediate layer that does not interfere with the effect of the invention, specifically, the effect of enhancing light applied during exposure and is supplementary to the effect may be provided between the metal film 1 and the resist polymer film 2. When the deposition is performed on a region with a large area using a method for controlling the arrangement of metal atoms in the metal layer 1, an additional film is sometimes provided between the resist polymer film 2 and the metal layer 1. Such an additional film may be formed by, for example, a deposition method using a metal complex. In such a case, for example, organic molecules can form the intermediate film. Additionally, in the invention, the resist film may be designed to utilize broad spectrum of the energy to the maximum extent out of the light irradiated during the exposure, and one or more additional layers for protective purposes, such as protecting the metal layer 1 from oxidation, may be provided on the metal layer 1 (in other words, on the side opposite to the resist polymer film 2). Therefore, the deposition of the metal layer 1 on the resist polymer film is neither limited to the case where the metal layer 1 is deposited directly on the resist polymer film 2 nor the case where nothing is provided on the deposited metal layer 1.

The improvement of the sensitivity by the invention would be attributed to the surface plasmon effect of the nanostructured metal in the metal layer 1 (see Non Patent Literatures 2 and 3). Examples of the effective structure of the metal layer 1 along the surface may include not only a simple thin sheet-shaped structure with a uniform thickness but also an island structure with metal particles scattered in the form of islands, a mesh structure with a large number of pore openings, a line structure with linear metal parts extending in a one-dimensional direction and arranged in the form of stripes substantially parallel to one another, or any other nanostructure in a direction or directions along the surface of the resist polymer film. The metal layer 1 may also have a periodically or regularly arranged structure. The laminated structure with such various fine structures can be formed using any of various metal deposition methods such as those mentioned above. As used herein, therefore, the term "layer" is intended to include not only a uniform thin sheet-shaped structure but also an island structure, a mesh structure, and any other structure having gaps or openings passing between the front and back sides. In addition, various methods compatible with processes for manufacturing semiconductor devices may be used to form such structures.

The metal layer 1 is characterized in that it can enhance light applied to the resist polymer film 2 when exposed to light. The thickness of the metal layer 1 should be so small that EUV light or an electron beam can at least partially pass through the metal layer 1 and the reflection and scattering of the applied light has substantially no adverse effect on the effective photosensitivity of the system. Preferably, the metal layer 1 has a thickness of about 15 nm or less as shown in the examples below, so that high photosensitivity can be obtained. In this regard, however, if the metal layer 1 has a structure in which gaps such as holes or narrow slits are regularly formed, it can be expected to have a sensitizing effect even though it is thicker.

Regardless of various conditions such as the resist material type and the development method, the invention is effective based on the mechanism suggested for the improvement of the sensitivity according to the invention. The metal used to form the metal film is also not limited to Ag shown in the examples below. The metal may also be any of various metals such as Au, Pt, Pd, Cu, Al, and Ni taking into account the conductivity of the metal, the plasma frequency specific to the metal type, and known technical matters for use in nanostructured arrays (see, for example, Non Patent Literature 4 and Patent Literature 1).

The invention uses a laminated structure essential for photolithographic techniques important for semiconductor manufacturing. Therefore, the invention is advantageous in that it is highly compatible with its applicable fields. In addition, the invention makes it possible not only to improve the sensitivity of the resist film in a region simply spread two-dimensionally but also to improve the sensitivity when one-dimensional patterns, namely, lines important for semiconductor manufacturing are exposed to light. In addition, according to the invention, the metal layer formed to improve the sensitivity can be removed simultaneously with the development of the resist film after exposure to light, which makes it possible to minimize the increase in the number of steps for a semiconductor manufacturing process.

EXAMPLES

Hereinafter, the invention will be more specifically described with reference to examples. It will be understood that the examples below are merely given by way of example to facilitate the understanding of the invention and should not be construed as limiting the invention.

In the examples, the sensitivity-improving effect of metal thin films is examined using electron beam exposure rather than EUV exposure. However, for example, Non Patent Literatures 5 and 6 show that photosensitivity to EUV exposure has a strong correlation with photosensitivity to electron beam exposure. Non Patent Literature 4 reports a study on alternative exposure methods under circumstances where EUV exposure is difficult to perform in practice because of limited availability of EUV exposure tools for EUV resist development. Specifically, this non patent literature reports that the photosensitivity of chemically amplified resists under electron beam exposure and KrF excimer laser beam exposure as candidates for alternative exposure methods was compared with that under EUV exposure and that the result obtained under electron beam exposure was close to that under EUV exposure. Non Patent Literature 6 concludes, in the section "3.4 Development of Resists for EUV (Extreme Ultraviolet) Exposure," that a correlation with respect to sensitivity was observed between electron beam (EB) lithography and EUV exposure as a result of the evaluation of the sensitivity in EB lithography and EUV exposure each using a chemically amplified positive resist produced from a fullerene derivative. As a matter of course, it should be noted that the examples below demonstrate that the sensitivity-improving effect is produced under electron beam exposure.

[Evaluation of the Sensitivity-Improving Effect of Metal Thin Films]

In order to evaluate the sensitivity-improving effect of the metal thin film according to the invention, the four types of resist films shown below were each formed on a Si wafer, and the photosensitivity of the resist films was evaluated using electron beam photolithography. In this evaluation, an Ag layer was formed by sputtering.

A: A resist film formed alone.
B: A laminated resist film obtained by forming a 5-nm-thick Ag layer on the same resist film as the resist film A.
C: A laminated resist film obtained by forming a 10-nm-thick Ag layer on the same resist film as the resist film A.
D: A laminated resist film obtained by forming a 20-nm-thick Ag layer on the same resist film as the resist film A.

Ag layers with thicknesses of 5 nm, 10 nm, and 20 nm were each formed directly on a Si wafer under the same conditions as those in the formation of the laminated resist films B, C, and D. FIGS. 2(a), 2(b), and 2(c), FIGS. 3(a), 3(b), and 3(c), and FIGS. 4(a) and 4(b) show the scanning electron microscope (SEM) images of the resulting Ag layers with thicknesses of 5 nm, 10 nm, and 20 nm, respectively, at different magnifications. It is apparent that any Ag layer with any thickness does not have a uniform structure, the 5-nm-thick Ag layer is in the form of islands, and as the thickness increases, the islands increase in size and become joined to one another to form a mesh structure.

Figure 5:
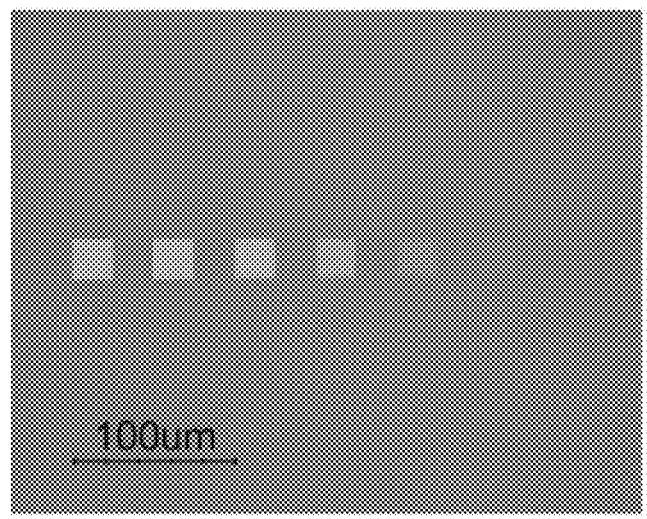
FIG. 5 is a micrograph showing the results of exposure and development of a resist film formed alone.
Figure 6:
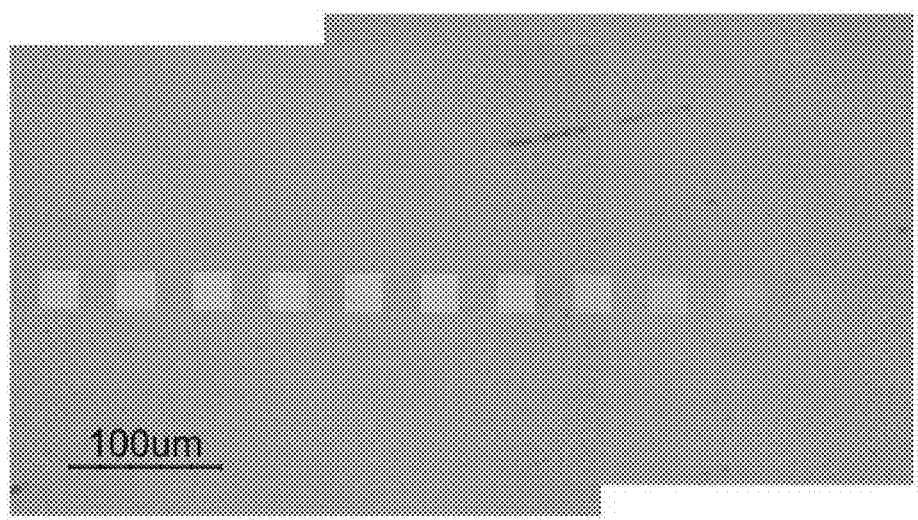
FIG. 6 is a micrograph showing the results of exposure and development of a laminated resist film including a resist film and a 5-nm-thick Ag layer formed thereon.
Figure 7:
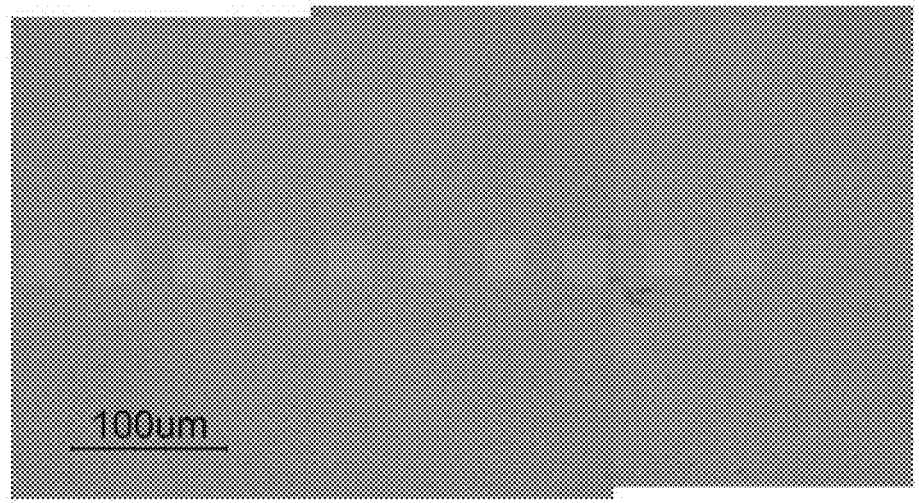
FIG. 7 is a micrograph showing the results of exposure and development of a laminated resist film including a resist film and a 10-nm-thick Ag layer formed thereon.

The laminated resist films B, C, and D having Ag layers with the three thicknesses and the resist film A with no Ag layer for comparison were each subjected to electron beam exposure and then developed in order to determine whether and how the resist films A to D differed in sensitivity. Specifically, the resist films A to D were each subjected to lithography in which 12 square regions were exposed to different amounts of electron beam radiation, and then subjected to a development process under the same conditions. The resulting micrographs are shown in the drawings. FIG. 5 is a micrograph showing the results of the development of the resist film A with no Ag layer for comparison. FIG. 6 is a micrograph showing the results of the development of the laminated resist film B with the 5-nm-thick Ag layer. FIG. 7 is a micrograph showing the results of the development of the laminated resist film C with the 10-nm-thick Ag layer. No micrograph is shown for the laminated resist film D with the 20-nm-thick Ag layer, because any square region was not able be developed with any amount of exposure in the resist film D. This would be because in the case of the resist film D, almost the whole of the electron beam is reflected and scattered by the metal layer deposited thicker than that in the resist film B or C, so that no photoreaction occurs in the resist film.

The electron beam exposure conditions were as follows.
Electron accelerating voltage: 50 kV
Electron beam current: 100 pA
Dot (pixel) interval in the process of drawing each square pattern with the electron beam: 20 nm vertically and horizontally The amounts of exposure for the respective square regions, specifically, the amounts of exposure per area to which the electron beam was applied (also referred to as the "doses" (beam current×exposure time per dot/dot area)) were as follows (in units of $\mu C/cm^{-2}$): 35.0 (maximum), 30.0, 25.0, 22.5, 20.0, 17.5, 15.0, 12.5, 10.0, 7.5, 5.0, and 2.5 (minimum). The exposure times per dot used to obtain these amounts of exposure were as follows: 1.4 µs, 1.2 µs, 1.0 µs, 0.9 µs, 0.8 µs, 0.7 µs, 0.6 µs, 0.5 µs, 0.4 µs, 0.3 µs, 0.2 µs, and 0.1 µs.

In FIGS. 5 to 7, the square regions mentioned above, which are aligned from left to right, look brighter than their surrounding background, and the brightness decreases as it goes from left to right. These square regions are arranged in order of the amounts of exposure shown above (therefore, the square region at the left end underwent the maximum amount of exposure). FIG. 5 shows the resist film A with no Ag layer, in which the sensitivity to the exposure is low so that the sixth or seventh square region from the left is only slightly visible, and therefore, the eighth-to-last square regions are not shown. FIGS. 6 and 7 are each a combination of two micrographs. This is because the square regions were sensitive to lower amounts of exposure in the exposure and development process for these photographs, so that the whole of the exposed regions were so widely spread that they did not fall within the range capable of being taken in a single micrograph.

As mentioned above, in FIG. 5 showing the resist film A with no Ag layer, the sixth or seventh square region from the left was only slightly observable. Therefore, it was determined that the photoreaction occurred until the amount of exposure reached 17.5 $\mu C/cm^{-2}$ to 15.0 $\mu C/cm^{-2}$. In contrast, it was determined that using the resist films B and C having the deposited Ag layers with thicknesses of 5 nm and 10 nm, respectively, the photoreaction occurred until the amount of exposure reached 5.0 $\mu C/cm^{-2}$ (the eleventh region from the left). This shows that the deposition of the 5- or 10-nm-thick Ag layer increases the sensitivity of the resist film by a factor of about 17.5/5.0 to about 15.0/5.0 (namely about 3.5 to about 3).

A comparison between the laminated resist films B and C having Ag layers with thicknesses of 5 nm and 10 nm, respectively, shows that the laminated resist film C has a slightly higher sensitivity whereas the laminated resist film B provides a sharper pattern edge. This would be because of the influence of the difference in the surface plasmon effect caused by the nanostructure in the thickness direction and/or the in-plane direction of the Ag layer. In addition, no photoreaction occurred when the Ag layer was 20 nm thick, but no reduction in photosensitivity was observed when the layer thickness was increased from 5 nm to 10 nm. From these results, it is suggested that the photosensitivity-improving effect can be obtained until the layer thickness reaches about 15 nm.

[Evaluation of the Sensitivity-Improving Effect on Linear Pattern]

Next, it was demonstrated that the invention is effective in improving sensitivity for a narrow line pattern as well as for a uniform plane. Such a narrow line pattern is frequently used in photolithography for semiconductor manufacturing. Therefore, the results further show that the invention is applicable to semiconductor lithography. In the cases shown below, metal films were formed with thicknesses of 5 nm and 10 nm, which provide good results in the above examples, and a case with no metal film was shown as needed for comparison. The metal used was Ag. Specifically, the narrow line pattern used in the examples below was a parallel line pattern in which long narrow regions to be exposed and a region therebetween not to be exposed are repeated many times. The repetition interval, in other words, the total of the width of one region to be exposed and the width of one region not to be exposed is referred to as the pitch size. In the examples shown below, the pitch size was from 100 nm to 520 nm. It will be understood that if it is possible to form such a repeated linear pattern in a resist film through exposure, a single line and a plurality of lines mutually arranged in a random manner can also be formed according to the invention.

Figure 8:
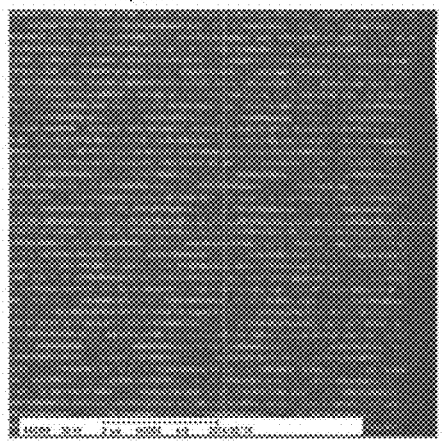
FIG. 8(a) is an SEM image showing the results of electron beam exposure to form a narrow line pattern in a case where no Ag layer is formed on a resist film.
FIG. 8(b) is an SEM image showing the results of electron beam exposure to form a narrow line pattern in a case where a 5-nm-thick Ag layer is formed on a resist film.
Figure 8:
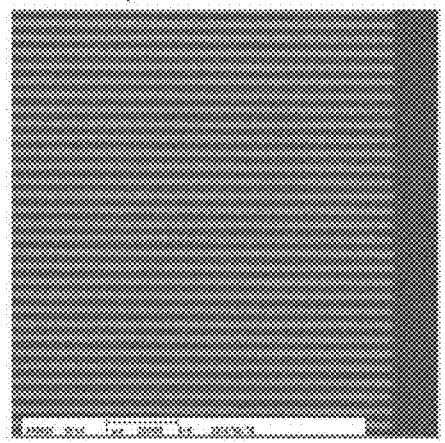

FIG. 8(a) is an SEM image showing the results of electron beam exposure in which a resist film with no metal layer formed thereon was patterned with a constant pitch size (200 nm) and a certain dose (34 μC/cm$^2$). FIG. 8(b) is an SEM image showing the results of electron beam exposure in which a resist film with a 5-nm-thick metal layer formed thereon was patterned with a constant pitch size (200 nm) and a certain dose (34 μC/cm$^2$). In these SEM images, the white parts correspond to the parts of the resist removed by photolithography. It is apparent from the SEM images that with the same dose, the amount of removal of the resist is increased when the metal layer is formed. This suggests that the metal layer formed in a narrow line pattern is also effective in improving the sensitivity of the resist during photoirradiation.

Figure 9:
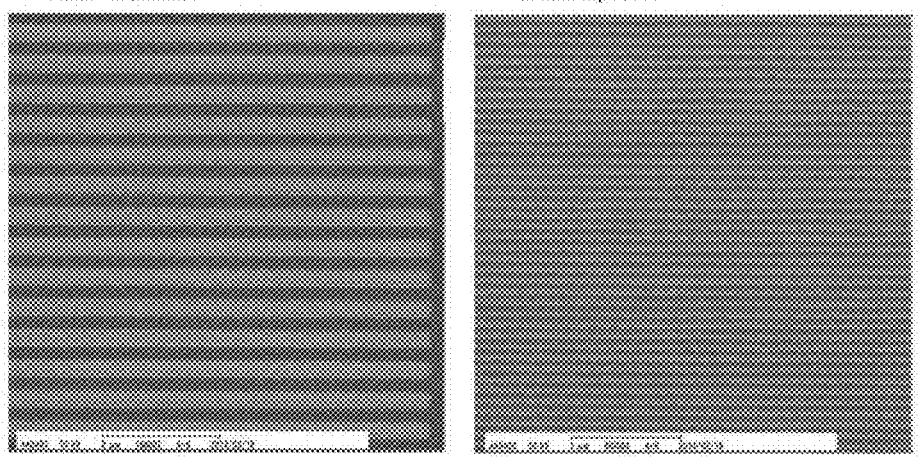
FIG. 9(a) is an SEM image showing the results of electron beam exposure to form a narrow line pattern with a pitch size of 520 nm.
FIG. 9(b) is an SEM image showing the results of electron beam exposure to form a narrow line pattern with a pitch size of 100 nm.

FIGS. 9(a) and 9(b) are SEM images showing the results of electron beam exposure with the same dose (48 μC/cm$^2$), the same metal layer thickness (5 nm), and different pitch sizes (520 nm in FIG. 9(a), 100 nm in FIG. 9(b)). These SEM images show that when the metal layer was formed, a sufficient level of sensitivity was achieved for the exposure in the pitch size range of 100 nm to 520 nm, and a sufficient level of resolution was also obtained without any problem such as breaking of narrow lines or merging of adjacent narrow lines. The results show that according to the invention, a resist film can be removed in a desired narrow line pattern by photolithography.

Figure 10:
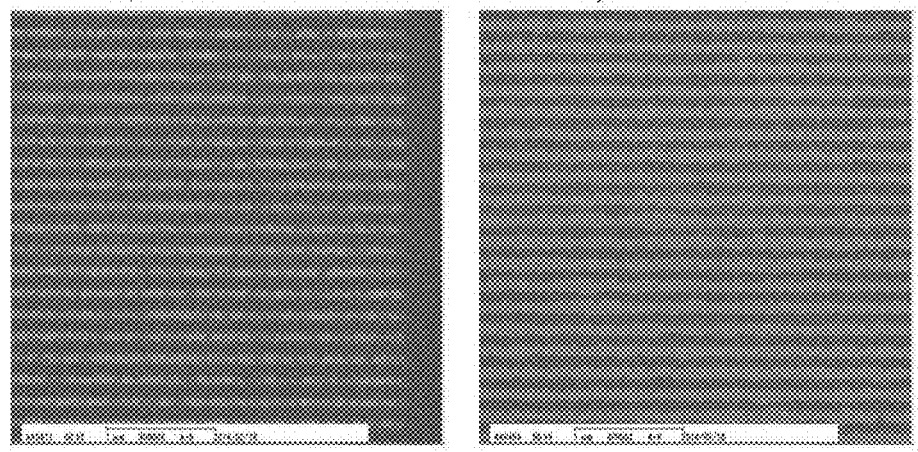
FIGS. 10(a) and 10(b) are SEM images for showing how the sensitivity changes when the thickness of a metal film is increased from 5 nm (FIG. 10(a)) to 10 nm (FIG. 10(b))

FIGS. 10(a) and 10(b) are SEM images for showing how the sensitivity changes when the metal layer thickness is increased from 5 nm (FIG. 10(a)) to 10 nm (FIG. 10(b)) with the pitch size (200 nm) kept unchanged. A comparison between these SEM images shows that the amount of removal of the resist is increased by increasing the metal layer thickness even though the dose is reduced from 24 μC/cm$^2$ (FIG. 10(a)) to 10 μC/cm$^2$ (FIG. 10(b)). In other words, it is apparent that the sensitivity can be increased by increasing the metal layer thickness.

Figure 11:
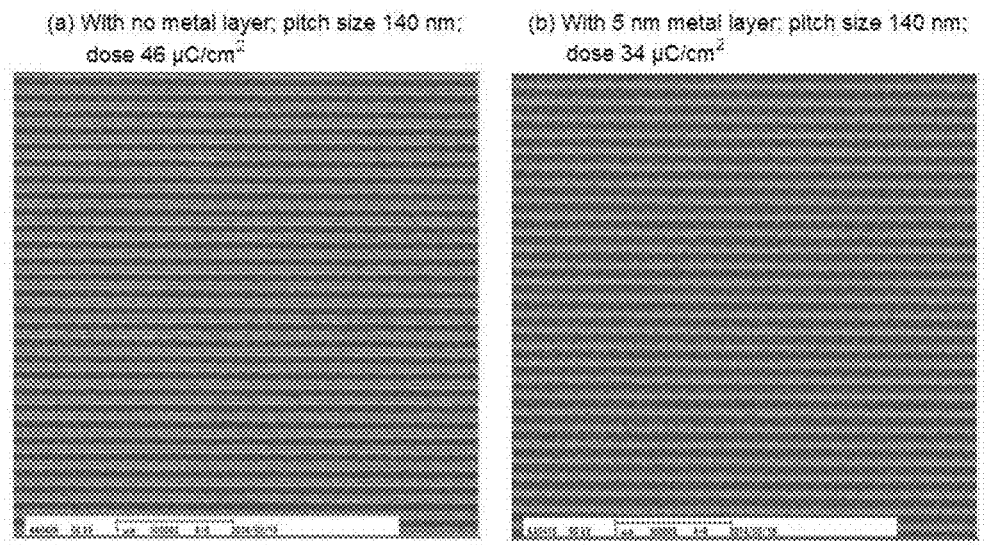
FIGS. 11(a) and 11(b) are SEM images showing the results of an experiment performed to estimate the rate of increase in sensitivity to linear pattern exposure due to the formation of a metal layer.

FIGS. 11(a) and 11(b) are SEM images showing the results of an experiment performed to estimate the rate of increase in sensitivity to linear pattern exposure due to the formation of a metal layer. FIG. 11 (a) shows a sample obtained by patterning a resist film with no metal layer formed thereon, and FIG. 11 (b) shows a sample obtained by patterning a resist film with a 5-nm-thick metal layer formed thereon. The samples were obtained with the same pitch size (140 nm), different amounts of exposure, and substantially the same degree of photoreaction. It was determined that the photosensitivity was the same between the case where the resist film with no metal layer was exposed with a dose of 46 μC/cm$^2$ (shown in FIG. 11(a)) and the case where the resist film with a 5-nm-thick metal layer formed thereon was exposed with a dose of 34 μC/cm$^2$ (shown in FIG. 11(b)). The reciprocal of the dose corresponds to the area removed per unit dose. If the reciprocal is regarded as the sensitivity, the rate of increase in the sensitivity is calculated from the following formula: the rate of increase in the sensitivity= ([the sensitivity of the resist film with the metal layer]−[the sensitivity of the resist film with no metal layer])/[the sensitivity of the resist film with the metal layer]=(1/34−1/46)/(1/46)=46/43−1=12/34≈0.35. Therefore, an increase in sensitivity of about 35% was obtained in this experiment on the exposure of linear regions.

In the previous section, the rate of increase in sensitivity due to the metal layer is determined with reference to FIGS. 5 to 7. This rate is defined in a different way from the rate of increase determined in this example. Specifically, when the rate of increase in sensitivity is determined with reference to FIGS. 5 to 7, a comparison is made between the minimum doses with which the photoreaction was observed (in other words, a comparison between the doses at the foot of the sensitivity curves). On the other hand, the rate of increase in sensitivity explained with reference to FIG. 11 is based on a comparison between the doses required to form substantially the same patterns acceptable for use in semiconductor lithography. Therefore, the latter method would provide a lower rate of increase because the requirements for linewidth and continuity need to be satisfied in the latter method.

The rate of increase in sensitivity of 35% may be considered to be very high in the fields of EUV exposure and electron beam exposure, particularly, in the field of EUV exposure. For reference, according to Non Patent Literature 7, the efficiency of conversion to EUV light known at present is 4.7% as the world's highest experimental level, and the results of simulations suggest that the conversion efficiency can be increased to about 8%. Therefore, it is meaningful that a large increase in sensitivity can be achieved by a method completely different from but potentially compatible with existing methods under circumstances where a significant improvement in dose or sensitivity cannot be expected by using the existing methods.

[Presence or Absence of Metal Layer Residue after Development]

It was found from experiments that after exposure and development, no metal film remains on the surface of the remaining resist film without performing any particular removal process. Specifically, the elemental composition of the surface of a residual resist film with a large area, on which the metal layer can be considered to be more likely to remain (specifically, a relatively large residual resist film as shown in FIGS. 5 to 7), was measured by energy dispersive X-ray analysis (EDX). The results of the X-ray spectrum and the elemental mapping of Ag, Si, and C are shown for a case where development was performed with no Ag layer (FIGS. 12(a) to 12(d)), a case where exposure and development were performed on a resist film with a 5-nm-thick Ag layer formed thereon (FIGS. 14(a) to 14(d)), and a case where exposure and development were performed on a resist film with a 10-nm-thick Ag layer formed thereon (FIGS. 16(a) to 16(d)). The SEM images of the surface of the residual resist films in the three cases, on which the X-ray spectrum analysis and the elemental analysis were performed, are shown in FIGS. 13, 15, and 17, respectively.

Figure 15:
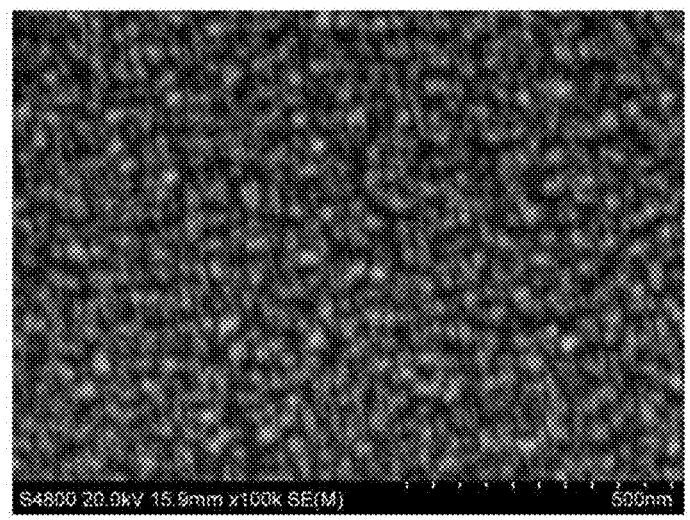
FIG. 15 is an SEM image of the residual resist surface subjected to the EDX measurement shown in FIGS. 14(a) to 14(d)

In this regard, although the resolution is not good, particulate matters are observable in the SEM image of the surface of the residual resist film in the case where exposure and development were performed after the 5-nm-thick Ag layer was formed (FIG. 15). However, the SEM image in the case where no Ag layer was formed (FIG. 13) and that in the case where the 10-nm-thick Ag layer was formed (FIG. 17) are significantly blurred. This is because in all cases after development, the residual resist surface is an insulator so that focusing is very difficult when SEM images are obtained. The SEM image of FIG. 15 happened to be taken in focus to some extent, but the images of FIGS. 13 and 17 were blurred because they were taken out of focus. In general, metal vapor deposition is performed in advance when the geometry of the surface of an insulator is observed. In this measurement, however, metal vapor deposition was intentionally not performed taking into account the possibility that the metal layer could be indistinguishable from the Ag layer for SEM observation. In this regard, it is conceivable that if the Ag layer remained on the resist film surface even after development, the resulting surface image would have been clearer. As a result of AFM measurement performed separately, it was observed that the surface of the residual resist film had a surface roughness of about 10 nm in all cases and that the surface had countless fine projections with a height of about 10 nm.

Figure 12:
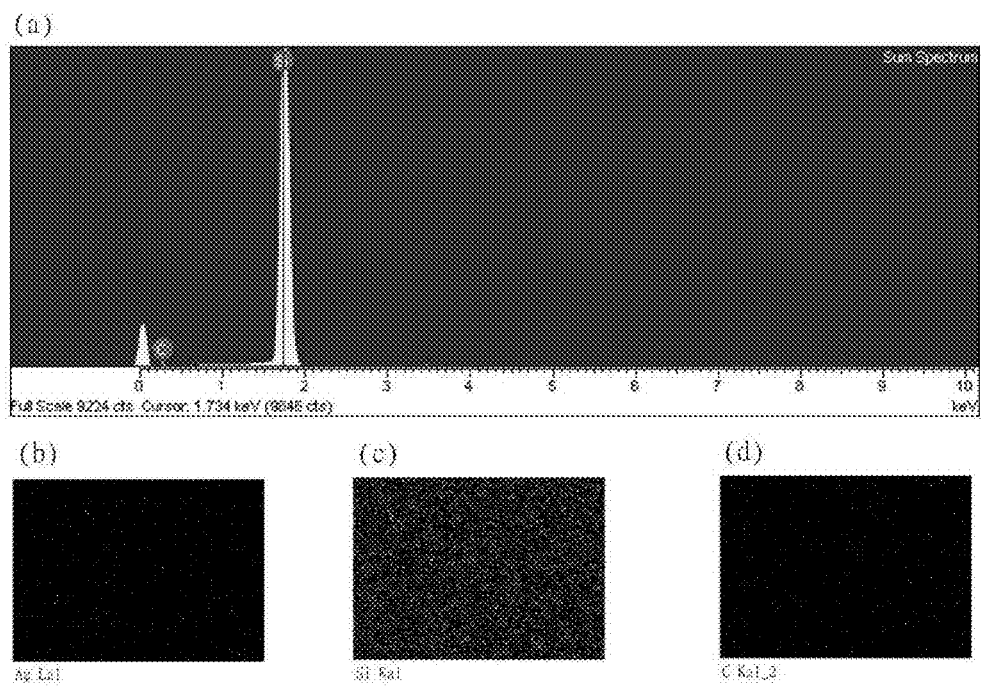
FIGS. 12(a), 12(b), 12(c), and 12(d) are charts which are for the evaluation of the presence or absence of a residual Ag layer after exposure and development of a resist film and show an X-ray spectrum and elemental mapping obtained by EDX measurement performed after a resist film with no Ag layer is subjected to exposure and development.
Figure 13:
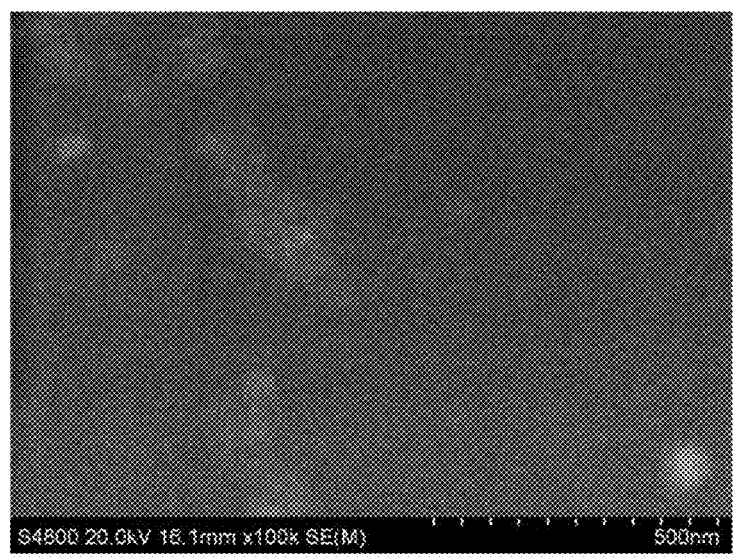
FIG. 13 is an SEM image of the residual resist surface subjected to the EDX measurement shown in FIGS. 12(a) to 12(d)
Figure 14:
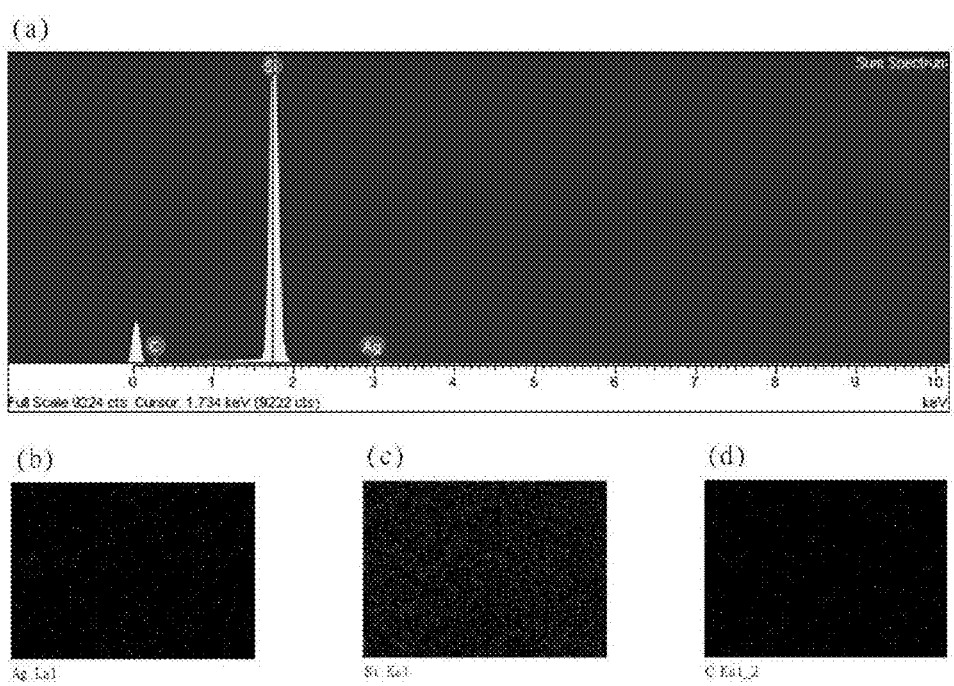
FIGS. 14(a), 14(b), 14(c), and 14(d) are charts showing, in the same way as FIGS. 12(a) to 12(d), the results of EDX measurement performed after a resist film with a 5-nm-thick Ag layer formed thereon is subjected to exposure and development.
Figure 14:
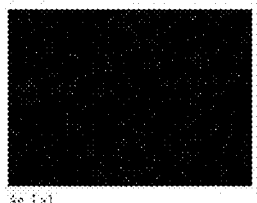
Figure 14:
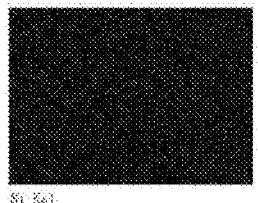
Figure 14:
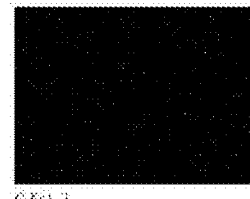
Figure 16:
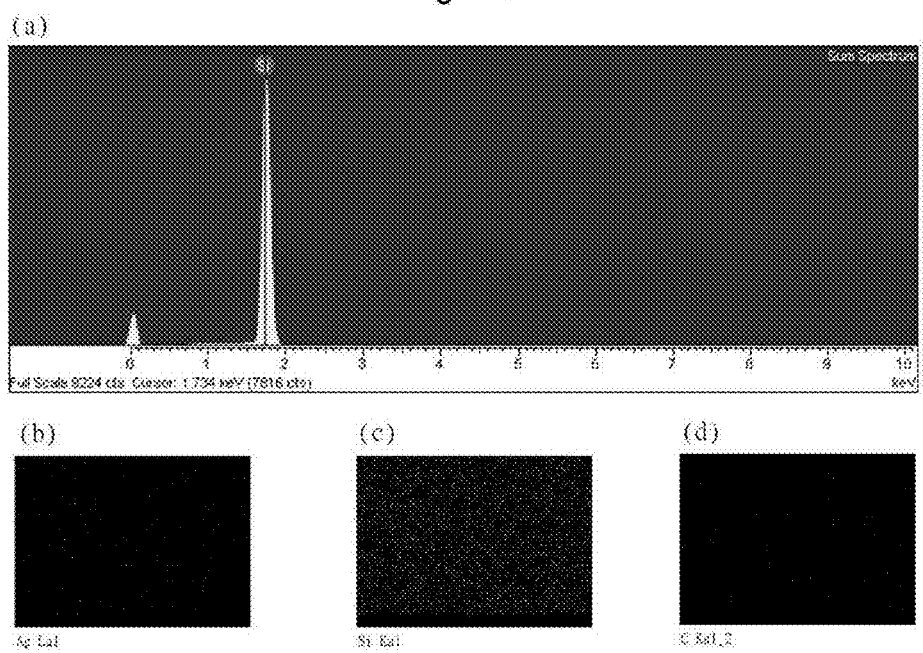
FIGS. 16(a), 16(b), 16(c), and 16(d) are charts showing, in the same way as FIGS. 12(a) to 12(d) and FIGS. 14(a) to 14(*d*), the results of EDX measurement performed after a resist film with a 10-nm-thick Ag layer formed thereon is subjected to exposure and development.
Figure 16:
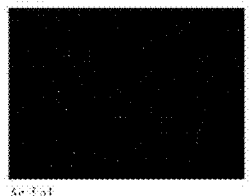
Figure 16:
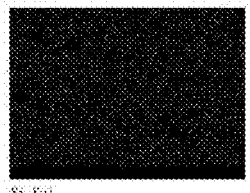
Figure 16:
Figure 17:
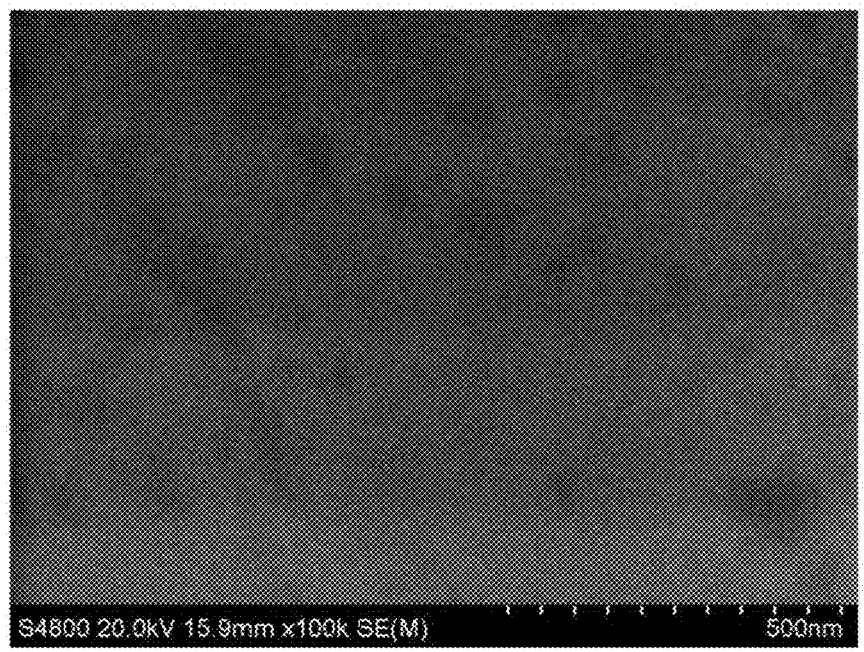
FIG. 17 is an SEM image of the residual resist surface subjected to the EDX measurement shown in FIGS. 16(*a*) to 16(*d*).

FIGS. 12(a), 14(a), and 16(a) show X-ray spectra in the respective cases. In the spectra, the peaks marked with C are derived from the resist (which may be slightly influenced by contaminants in the handling process), and the peaks marked with Si seem to be results of the detection of the component element of the substrate. FIG. 12(a) does not show any peak corresponding to the Ag component. FIG. 16(a) also shows the same result in the case where exposure and development were performed using a 10-nm-thick Ag layer. As shown in FIG. 14(a), only a trace amount of Ag was observed in the case where the Ag layer was 5 nm thick. In addition, the elemental mapping of Ag, Si, and C for the residual resist is shown in the FIGS. 12(b), 12(c), and 12(d), FIGS. 13(b), 13(c), and 13(d), and FIGS. 14(b), 14(c), and 14(d), respectively. These results also show that when exposure and development are performed using a Ag layer, almost no Ag remains even though the Ag layer thickness is changed.

The results of the elemental analysis described above for the residual resist film are shown as values in Table 1.

TABLE 1

|  | C (K-line) | Si (K-line) | Ag (L-line) |
|---|---|---|---|
| With no Ag layer | 7.42 (15.81) | 92.33 (84.13) | 0.25 (0.06) |
| With 5-nm-thick Ag layer | 7.61 (16.26) | 91.38 (83.50) | 1.01 (0.24) |
| With 10-nm-thick Ag layer | 0.45 (1.04) | 99.64 (98.99) | −0.08 (−0.02) |

As for the data in the table, the values outside the parentheses are in units of % by weight, and those inside the parentheses are in units of % by atom. In this measurement, the accelerating voltage was relatively as high as 20 kV. Therefore, the detection region was widened in the depth direction so that it extended not only to the residual resist layer but also to the surface layer part of the Si substrate. This seems to make the composition ratio of Si considerably high. In addition, the composition ratio of C significantly varies with the thickness of the residual resist film. However, if Ag remained, substantially all of it would have been detected in this measurement, because Ag should exist only on the surface of the residual resist.

An initial glance at Table 1 might suggest that a slight amount of Ag is detected particularly when the resist layer with a 5-nm-thick Ag layer formed thereon is subjected to exposure and development. However, considering that the accuracy of this measurement in units of % by weight is of the order of 1%, it can be concluded that no significant amount of residual Ag was detected in all the three cases (with no Ag layer, with a 5-nm-thick Ag layer formed, and with a 10-nm-thick Ag layer formed) shown in Table 1. Therefore, it has been demonstrated that the Ag layer present on the resist film at the exposure stage is substantially removed at the development stage so that there is no need to add a special step of removing the Ag layer to the manufacturing process.

INDUSTRIAL APPLICABILITY

As described above, the invention makes it possible to significantly improve the sensitivity of resist films even when the type of resist materials used is kept unchanged. Therefore, the invention is expected to significantly contribute to the commercialization of photolithography using EUV light or electron beams.

REFERENCE SIGNS LIST

1: Metal layer
2: Resist polymer film
3: Si substrate

CITATION LIST

Patent Literature

Patent Literature 1: JP 2010-275180 A

Non Patent Literature

Non Patent Literature 1: KYOH Suigen et al., Toshiba Review, Vol. 67, No. 4, 36-40 (2012)
Non Patent Literature 2: Takahiro SUZUKI et al., Journal of the Crystallographic Society of Japan, 50, 282-287 (2008)
Non Patent Literature 3: Wikipedia, "Surface Plasmon Resonance," http://ja.wikipedia.org/wiki/%E8%A1%A8%E9%9D%A2%E3%83%97%E3%83%A9%E3%82%BA%E3%83%A2%E3%83%B3%E5%85%B1%E9%B3%B4
Non Patent Literature 4: Elito KAZAWA, Bulletin of Tokyo Metropolitan Industrial Technology Research Institute, No. 6 (2011)
Non Patent Literature 5: Daisuke SHIMIZU et al., JSR TECHNICAL REVIEW No. 114, 9-14 (2007)
Non Patent Literature 6: Katsutomo TANAKA et al., NanotechJapan Bulletin Vol. 3, No. 6, 16-1-16-7 (2010)
Non Patent Literature 7: http://techon.nikkeibp.co.jp/article/FEATURE/20130514/281330/

The invention claimed is:
1. A method of improving sensitivity of a resist film, the method comprising the steps of:
preparing a laminated resist film by covering an entire surface of an EUV light-sensitive resist polymer film with a metal layer having a thickness of at most 15 nm; and
irradiating an EUV light according to a desired pattern over the metal layer of the laminated resist film to form the desired pattern in the resist polymer film under an irradiated portion of the metal layer,
wherein the thickness of the metal layer is such that the EUV light at least partially passes therethrough, and
the metal layer has a gap or an opening that passes through the metal layer from one side to the other.
2. The method of improving sensitivity of a resist film according to claim 1, wherein a line is formed in the laminated resist film by the irradiation of the EUV light.
3. The method of improving sensitivity of a resist film according to claim 1, further comprising the step of remov- ing the metal layer by developing the laminated resist film after the irradiation of the EUV light.

4. The method of improving sensitivity of a resist film according to claim 1, wherein the metal layer comprises a metal or an alloy containing a metal selected from the group consisting of Ag, Au, Pt, Pd, Cu and Ni.

5. The method of improving sensitivity of a resist film according to claim 1, wherein the metal layer has a linear structure, an island structure, or a mesh structure.

\* \* \* \* \*